US011380612B2

(12) United States Patent
Stecher et al.

(10) Patent No.: US 11,380,612 B2
(45) Date of Patent: Jul. 5, 2022

(54) SEMICONDUCTOR DEVICE, ELECTRONIC COMPONENT AND METHOD

(71) Applicant: Infineon Technologies Austria AG, Villach (AT)

(72) Inventors: Matthias Stecher, Munich (DE); Martin Kotzbauer, Regenstauf (DE); Julie Mathilde Suzanne Paye, Munich (DE); Andreas Zankl, Wiesent (DE)

(73) Assignee: Infineon Technologies Austria AG, Villach (AT)

( * ) Notice: Subject to any disclaimer, the term of this patent is extended or adjusted under 35 U.S.C. 154(b) by 605 days.

(21) Appl. No.: 15/837,476

(22) Filed: Dec. 11, 2017

(65) Prior Publication Data

US 2018/0166375 A1 Jun. 14, 2018

(30) Foreign Application Priority Data

Dec. 12, 2016 (GB) ..................................... 1621079

(51) Int. Cl.
*H01L 23/498* (2006.01)
*H01L 23/522* (2006.01)
*H01L 23/00* (2006.01)
*H01L 23/31* (2006.01)
*H04L 25/02* (2006.01)

(52) U.S. Cl.
CPC .... *H01L 23/49894* (2013.01); *H01L 23/3171* (2013.01); *H01L 23/3192* (2013.01);
(Continued)

(58) Field of Classification Search
CPC ........... H01L 23/49894; H01L 23/5227; H01L 24/19; H01L 23/49822; H01L 23/5222; H01L 24/05; H01L 24/06; H01L 24/48; H01L 24/49; H01L 24/08; H01L 23/3114; H01L 23/5389; H01L 23/544; H01L 24/11; H01L 24/12; H01L 29/402; H01L 23/52221; H01L 24/031; H01L 24/061;
(Continued)

(56) References Cited

U.S. PATENT DOCUMENTS

2005/0104207 A1  5/2005  Dean et al.
2005/0258484 A1  11/2005  Itou
(Continued)

FOREIGN PATENT DOCUMENTS

CN       1825544 A    8/2006
CN     101159253 A    4/2008
(Continued)

*Primary Examiner* — Mouloucoulaye Inoussa
(74) *Attorney, Agent, or Firm* — Murphy, Bilak & Homiller, PLLC

(57) ABSTRACT

In an embodiment, a semiconductor device includes a galvanically isolated signal transfer coupler having a contact pad. The contact pad includes a metallic base layer, a metallic diffusion barrier layer arranged on the metallic base layer, and a metallic wire bondable layer arranged on the metallic diffusion barrier layer. The metallic diffusion barrier layer includes a first portion and a second portion. The first portion has a first surface and a second surface opposing the first surface. The first surface has a curved surface at the periphery. The first portion extends in a transverse plane and has a width. The second portion protrudes from the second surface intermediate the width of the first portion.

15 Claims, 10 Drawing Sheets

(52) U.S. Cl.
CPC .... *H01L 23/49822* (2013.01); *H01L 23/5222* (2013.01); *H01L 23/5227* (2013.01); *H01L 24/03* (2013.01); *H01L 24/05* (2013.01); *H01L 24/19* (2013.01); *H01L 24/45* (2013.01); *H01L 24/48* (2013.01); *H01L 2224/039* (2013.01); *H01L 2224/03464* (2013.01); *H01L 2224/03831* (2013.01); *H01L 2224/03848* (2013.01); *H01L 2224/04042* (2013.01); *H01L 2224/05147* (2013.01); *H01L 2224/05155* (2013.01); *H01L 2224/05157* (2013.01); *H01L 2224/05164* (2013.01); *H01L 2224/05556* (2013.01); *H01L 2224/05644* (2013.01); *H01L 2224/05655* (2013.01); *H01L 2224/05664* (2013.01); *H01L 2224/45015* (2013.01); *H01L 2224/45124* (2013.01); *H01L 2224/45144* (2013.01); *H01L 2224/45147* (2013.01); *H01L 2224/48137* (2013.01); *H01L 2224/48247* (2013.01); *H01L 2224/48257* (2013.01); *H01L 2224/48463* (2013.01); *H01L 2224/48644* (2013.01); *H01L 2224/48655* (2013.01); *H01L 2224/48664* (2013.01); *H01L 2224/48744* (2013.01); *H01L 2224/48755* (2013.01); *H01L 2224/48764* (2013.01); *H01L 2224/48844* (2013.01); *H01L 2224/48855* (2013.01); *H01L 2224/48864* (2013.01); *H01L 2224/49171* (2013.01); *H01L 2224/85375* (2013.01); *H01L 2924/10253* (2013.01); *H01L 2924/181* (2013.01); *H04L 25/0266* (2013.01)

(58) Field of Classification Search
CPC ................ H01L 24/03; H01L 24/5227; H01L 21/76816; H01L 22/32; Y02E 10/501
USPC .... 257/488, 771, 21.518, 23.01, 23.02, 737; 257/773, 21.582, 23.068, 531, 503, 758; 438/670, 613, 614, 687, 677, 637, 629, 438/612, 424, 689; 136/256
See application file for complete search history.

(56) References Cited

U.S. PATENT DOCUMENTS

| | | | |
|---|---|---|---|
| 2008/0122078 A1* | 5/2008 | He | H01L 21/76834 257/737 |
| 2009/0218686 A1* | 9/2009 | Saitou | H01L 23/544 257/737 |
| 2010/0244263 A1* | 9/2010 | Lin | H01L 24/11 257/758 |
| 2012/0060917 A1* | 3/2012 | Jin | H01L 31/022433 136/256 |
| 2012/0097430 A1 | 4/2012 | Chou et al. | |
| 2013/0181338 A1 | 7/2013 | Lu et al. | |
| 2013/0278372 A1* | 10/2013 | Stecher | H01L 28/10 336/200 |
| 2013/0280879 A1* | 10/2013 | Stecher | H01L 23/5329 438/381 |
| 2014/0273825 A1 | 9/2014 | Sapone et al. | |
| 2015/0255551 A1* | 9/2015 | Kerber | H01L 23/5227 257/488 |
| 2015/0372073 A1* | 12/2015 | Menath | H01L 23/64 257/531 |

FOREIGN PATENT DOCUMENTS

| | | |
|---|---|---|
| CN | 101636831 A | 1/2010 |
| CN | 102177575 A | 9/2011 |
| CN | 103050476 A | 4/2013 |
| CN | 103632985 A | 3/2014 |
| CN | 105280508 A | 1/2016 |
| CN | 105826421 A | 8/2016 |
| CN | 106057775 B | 8/2020 |
| EP | 1006576 A1 | 6/2000 |
| EP | 2509106 A1 | 10/2012 |
| EP | 2775522 A1 | 9/2014 |
| EP | 2980841 A1 | 2/2016 |
| JP | S63287037 A | 11/1988 |
| JP | 2002289761 A | 10/2002 |
| JP | 2006005325 A | 1/2006 |
| JP | 2012146720 A | 8/2012 |
| KR | 20000035730 A | 6/2000 |
| KR | 20150135255 A | 12/2015 |

* cited by examiner

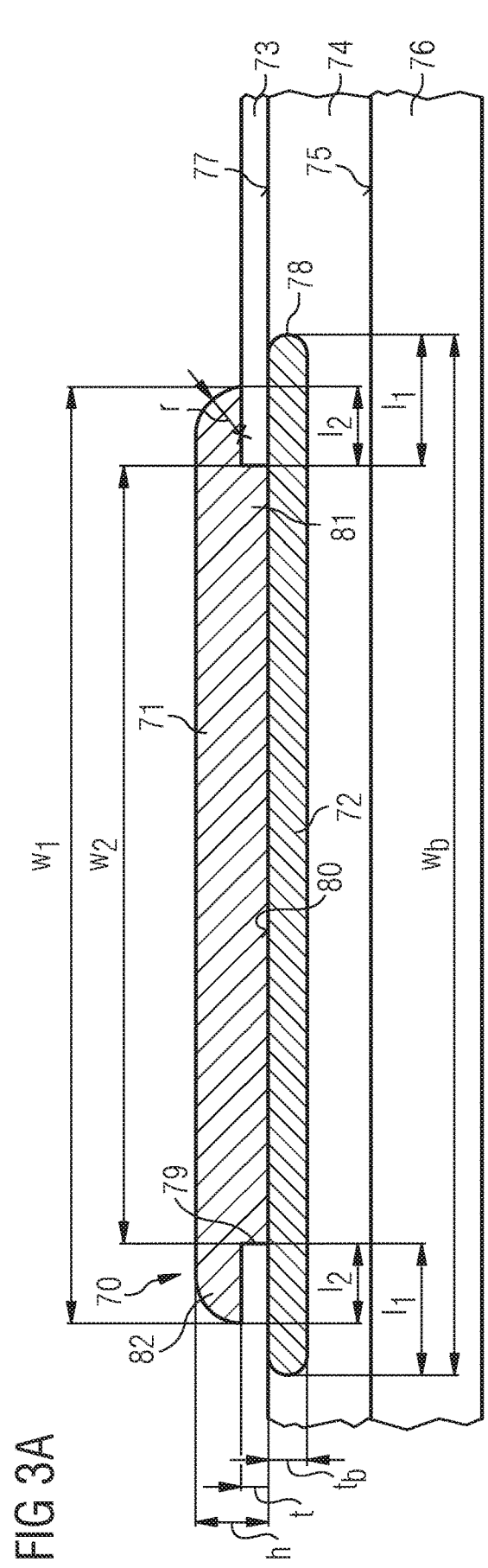

SEMICONDUCTOR DEVICE, ELECTRONIC COMPONENT AND METHOD

BACKGROUND

In some applications, two or more electric circuits communicate, for example, by bidirectional signal exchange. If the electric circuits have a ground at different potentials, galvanic isolation may be used to prevent current flow between the electric circuits whilst permitting communication between the electric circuits. Galvanic isolation may be based on optical, capacitive or inductive communication for example. An example of a device for inductive galvanic isolation and signal exchange is a coreless transformer which includes a primary winding and a secondary winding separated by an isolation layer that is sufficiently thin to allow bidirectional transmission of signals.

In some applications in which electric power and information are transferred from a higher-voltage network, such as the grid, to a lower-voltage network, such as a domestic power supply network, reinforced galvanic isolation against spikes of up to 10 kV or higher is desirable, if not required by regulatory authorities.

SUMMARY

In an embodiment, a semiconductor device includes a galvanically isolated signal transfer coupler including a contact pad. The contact pad includes a metallic base layer, a metallic diffusion barrier layer arranged on the metallic base layer, and a metallic wire bondable layer arranged on the metallic diffusion barrier layer. The metallic diffusion barrier layer includes a first portion and a second portion. The first portion has a first surface including a curved surface at the periphery and a second surface opposing the first surface. The first portion extends in a transverse plane and has a width. The second portion protrudes from the second surface intermediate the width of the first portion.

In some embodiments, the semiconductor device further includes a first isolation layer arranged on peripheral regions of the metallic base layer and having a first opening exposing a portion of the metallic base layer, wherein the second portion of the metallic diffusion barrier layer is arranged in the first opening in the first isolation layer and the first portion of the metallic diffusion barrier layer extends onto a surface of the first isolation layer adjacent the first opening.

In some embodiments, the semiconductor device further includes a metallic passivation layer on the metallic wire bondable layer.

In some embodiments, the metallic base layer includes copper, and/or the metallic diffusion barrier layer includes NiP, and/or the metallic wire bondable layer includes Pd and/or the metallic passivation layer includes Au.

In some embodiments, the semiconductor device further includes a second isolation layer arranged on peripheral regions of the metallic wire bondable layer and including a second opening exposing a portion of the metallic wire bondable layer. The metallic passivation layer may be arranged in and bounded by the second opening.

In some embodiments, the semiconductor device further includes a third isolation layer including a ring arranged on the first isolation layer and a fourth isolation layer arranged on outer faces of the third isolation layer.

In some embodiments, the first isolation layer includes hydrogenated $Si_xN_y$ and the second isolation layer includes an imide.

In some embodiments, the third isolation layer includes $SiO_x$ or phosphosilicate glass and the fourth isolation layer includes hydrogenated $Si_xN_y$.

In some embodiments, the galvanically isolated signal transfer coupler includes an inductive coupler including a planar coil coupled to the contact pad.

In some embodiments, the inductive coupler includes a second planar coil arranged in a stack with the first planar coil and galvanically isolated from the first planar coil by a isolation layer including $SiO_x$ and is configured to provide reinforced galvanic isolation for a surge pulse isolation voltage $V_{IOSM}$ of at least 10 $kV_{peak}$.

In some embodiments, the semiconductor device further includes a third planar coil that is arranged substantially coplanar with the first planar coil and is coupled to the contact pad.

In some embodiments, the planar coil and the metallic base layer are integrated in a semiconductor die.

In some embodiments, the galvanically isolated signal transfer coupler includes a capacitive coupler and the contact pad provides a plate of the capacitive coupler.

In an embodiment, an electronic component includes the semiconductor device according to any one of the previously described embodiments and a bidirectional signal transfer path coupled to the semiconductor device. A galvanically isolated signal transfer coupler is coupled in the bidirectional signal transfer path and is coupled by a bond wire to the semiconductor device. The galvanically isolated signal transfer coupler provides reinforced galvanic isolation for a surge pulse isolation voltage $V_{IOSM}$ of at least 10 $kV_{peak}$.

In some embodiments, the electronic component further includes a further semiconductor device being coupled to the semiconductor device by way of the bidirectional signal transfer path.

In an embodiment, a method for forming a contact pad includes depositing a metallic diffusion barrier layer onto a surface of a metallic base layer exposed in a first opening of a first isolation layer that covers a peripheral region of the metallic base layer such that the metallic diffusion barrier layer extends onto an outer surface of the first isolation layer. The metallic diffusion barrier layer is annealed and a metallic wire bondable layer is deposited onto the annealed metallic diffusion barrier layer.

In some embodiments, the metallic diffusion barrier layer is deposited using electro-chemical deposition or galvanic deposition.

In some embodiments, the method further includes depositing a second isolation layer onto peripheral regions of the metallic wire bondable layer defining a second opening exposing a portion of the wire bondable layer.

In some embodiments, the method further includes depositing a metallic passivation layer onto the metallic wire bondable layer such that the second isolation layer bounds the metallic passivation layer.

In an embodiment, a semiconductor device is provided that includes a galvanically isolated signal transfer coupler including a contact pad. The contact pad includes a metallic base layer and a metallic anchoring layer arranged on the metallic base layer. The metallic anchoring layer includes a first portion and a second portion. The first portion has a first surface and a second surface opposing the first surface. The first surface of the first portion includes a curved surface at the periphery. The first portion extends in a transverse plane and has a width. The second portion protrudes from the second surface intermediate the width of the first portion.

In some embodiments, the metallic anchoring layer and/or the metallic base layer includes copper.

In some embodiments, the semiconductor device further includes a first isolation layer arranged on peripheral regions of the metallic base layer and having a first opening exposing a portion of the metallic base layer, wherein the second portion of the metallic anchoring layer is arranged in the first opening in the first isolation layer and the first portion of the metallic anchoring layer extends onto a surface of the first isolation layer adjacent the first opening.

In some embodiments, the first isolation layer includes $SiO_x$.

In some embodiments, the semiconductor device further includes a metallic adhesion promotion layer lining the first opening. In some embodiments, the semiconductor device further includes an insulating passivation layer arranged on the first surface of the metallic anchoring layer.

In some embodiments, the insulating passivation layer includes $Al_2O_3$ or $Si_xN_y$. In some embodiments, the first isolation layer includes $Si_xN_y$.

In some embodiments, the metallic anchoring layer is in direct contact with the metallic base layer, the side walls of the first opening and surface of the insulating layer adjacent the first opening.

In some embodiments, the semiconductor device further includes one or more metallic layers arranged on the metallic anchoring layer.

In some embodiments, the one or more further metallic layers include a NiP layer arranged on an outer surface of the anchoring layer, a Pd layer arranged on the NiP layer and a Au layer arranged on the NiP layer.

Those skilled in the art will recognize additional features and advantages upon reading the following detailed description, and upon viewing the accompanying drawings.

BRIEF DESCRIPTION OF DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 3a illustrates a contact pad for an inductive or a capacitive coupler.

FIG. 3b illustrates an enlarged view of the contact pad of FIG. 3a.

DETAILED DESCRIPTION OF THE DRAWINGS

Figure 1A:
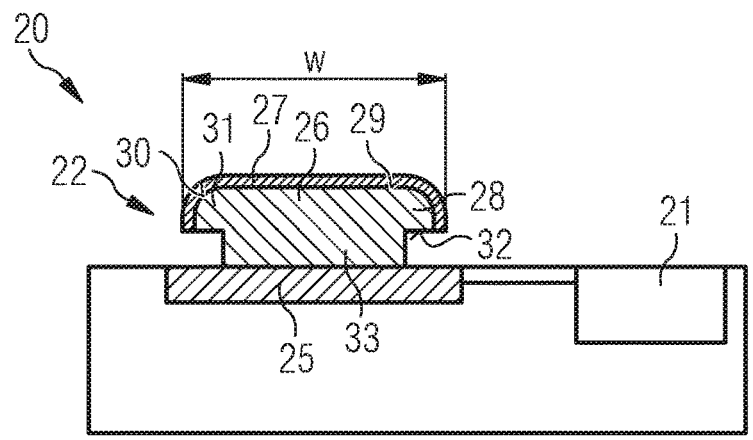
FIG. 1a illustrates a semiconductor device including a galvanically isolated signal transfer coupler including a contact pad according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "transverse" or "transverse direction" and "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Galvanic isolation in power equipment refers to an arrangement in which an output power circuit is electrically and physically isolated from an input power circuit to prevent current flow. Energy or information can still be exchanged between the circuits by other means, such as capacitance, induction or electromagnetic waves, or by optical, acoustic or mechanical means. Galvanic isolation may be used where two or more electric circuits are to communicate, but their grounds are at different potentials, for example. Common reasons for providing galvanic isolation include safety from fault conditions in industrial grade products and applications in which communication between devices is needed but each device regulates its own power.

In some electronic systems, control functions are provided by lower voltage circuitry that is galvanically isolated from high-power circuitry. A bidirectional signal path between the lower-voltage circuitry and the higher-voltage circuitry can be used, for example, to transmit control data from a system controller to a power supply and to receive monitoring data from the power supply. When the high-power circuitry defines a power supply, high-voltage electrical isolation from earth or ground may be required for the power supply system by common industry practice or regulatory authorities. For reinforced galvanic isolation, examples of industry standards which may be referred to in such practices and regulations include ICE-60747-5-5 or VDE0884-11. For basic galvanic isolation, an example of an industry standard which may be referred to is IEC 60664-1 and VDE0884-11.

One way of providing a bidirectional signal path that provides galvanic isolation between higher-voltage circuitry and lower voltage circuitry is a transformer or inductive coupler in which the signal is transmitted inductively.

Embodiments described herein may be used to provide a connection structure for use in an inductive coupler and a device including at least one coil of an inductive coupler with a contact pad which is more robust in fault conditions and which may, when used, increase the operational lifetime of the inductive coupler or device. An inductive coupler may also be called a transformer. In some embodiments, the transformer is a coreless transformer including a primary coil and a secondary coil that are positioned close enough together to facilitate reliable data exchange and which are sufficiently isolated from one another to provide galvanic isolation. The primary and secondary coils may be planar coils that are integrated into a semiconductor die which may include further circuitry.

A further way of providing a bidirectional signal path that provides galvanic isolation between higher-voltage circuitry and lower voltage circuitry is a capacitive coupler in which the signal is transmitted capacitively.

Embodiments described herein may be used to provide a connection structure for use in a capacitive coupler. A capacitive coupler may include two conductive plates separated by a dielectric. The two conductive plates of the capacitive coupler may be integrated into a semiconductor die which may include further circuitry.

Figure 1B:
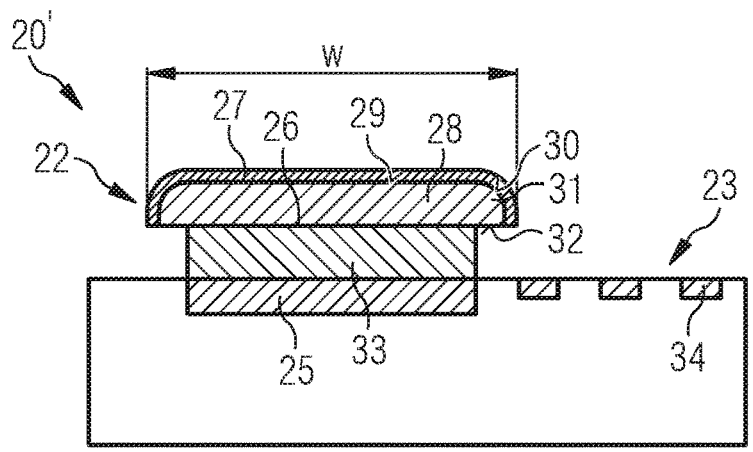
FIG. 1b illustrates a semiconductor device including a galvanically isolated signal transfer coupler including an inductive coupler including a planar coil and a contact pad according to an embodiment.
Figure 1C:
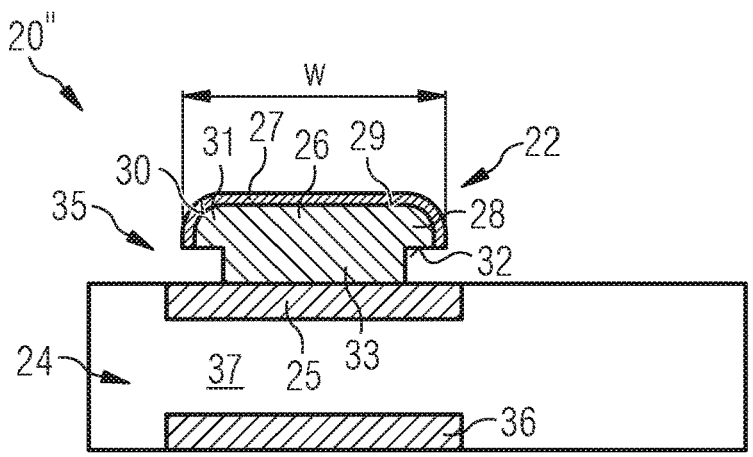
FIG. 1c illustrates a semiconductor device including a galvanically isolated signal transfer coupler including a capacitive coupler including a contact pad according to an embodiment.

FIG. 1a illustrates a semiconductor device 20 including a galvanically isolated signal transfer coupler 21 including a contact pad 22 according to an embodiment. The galvanically isolated signal transfer coupler 21 may enable bidirectional signal exchange and may include an inductive coupler 23, as illustrated in the embodiment of FIG. 1b or a capacitive coupler 24 as illustrated in the embodiment of FIG. 1c.

The contact pad 22 includes a metallic base layer 25, a metallic diffusion barrier layer 26 arranged on the metallic base layer 25 and a metallic wire bondable layer 27 arranged on the metallic diffusion barrier 26. The metallic diffusion barrier layer 26 includes a first portion 28 that has a first outer surface 29 including a curved surface 30 at the periphery 31 and a second surface 32 opposing the first surface. The first portion 28 extends in a transverse plane and has a width. The metallic diffusion barrier layer 26 further includes a second portion 33 which protrudes from the second surface 32 intermediate the width of the first portion 28. The width of the first portion 28 refers to the width, x, of the first portion 28 in the transverse plane.

Since the second portion 33 protrudes from the second surface 32 intermediate the width of the first portion 28, the second surface 32 surrounds the second portion 33 on all sides at the junction between the first portion 28 and the second portion 29 or in other words, the first portion 28 extends on all sides from the second portion 33. The lateral area of the first portion 28 is greater than the lateral area of the second portion 33. The metallic diffusion barrier layer 26 has a shape which may be described as a mushroom-type shape with a head that has a lateral area that is greater than a lateral area of a pin protruding from the lower surface of the head.

The contact pad 22, in particular, the first portion 28 or head includes a periphery with an outer curved surface extending towards the second surface 32 and the second portion 33 or pin of the metallic diffusion barrier layer 26. The curved surface of the periphery avoids the presence of sharp edges at the outermost surface of the metallic diffusion barrier layer 28 which may assist in increasing the robustness of the galvanically isolated signal transfer coupler 21 to a fault condition, for example a transient voltage spike, and may assist in increasing the operational lifetime of the galvanically isolated signal transfer coupler 21 and semiconductor device 20.

The central region of the first surface 29 may be substantially planar for accepting the head of a bond wire connection for coupling the galvanically isolated signal transfer coupler 21 to a circuit for signal transmission or exchange. The periphery 31 of the first surface 29 of the first portion 28 may have a radius of curvature, r, which lies within the range 0.5 to 2 times the maximum height of the first portion 28. The metallic wire bondable layer 27 may conformally cover the first surface 29 of the first portion 28 and may also have a substantially planar central portion and curved surface at the periphery.

FIG. 1b illustrates a semiconductor device 20' including the galvanically isolated signal transfer coupler 21 in the form of an inductive coupler 23 including a planar coil 34 which is coupled to the contact pad 22.

The inductive coupler 23 may also be called a transformer and may be a coreless transformer. The inductive coupler 23 may be used for providing inductive bidirectional data exchange in a device having reinforced galvanic isolation.

The planar coil 34 may include an outer end formed by the contact pad 22. The metallic base layer 25 of the contact pad 22 may be substantially coplanar with the windings of the planar coil 34 of the inductive coupler 21. In some embodiments, the planar coil 34 is a spiral planar coil which includes the contact pad 22 at its outer end and includes a second contact pad at its inner end, which is positioned at the centre of the spiral.

FIG. 1c illustrates a semiconductor device 20" including the galvanically isolated signal transfer coupler 21 in the form of a capacitive coupler including the contact pad 22. The contact pad 22 forms a first plate 35 of a pair of plates 35, 36 providing a capacitor. The plates 35, 36 are spaced apart from one another by a dielectric 37.

In some embodiments, the first portion 28 of the metallic diffusion barrier 26 of the contact pad 22 has a longitudinal axis extending substantially perpendicular to the transverse plane of the first portion 28 and the second portion 33 has a longitudinal axis which is aligned with the longitudinal axis of the first portion 28. In these embodiments, the second portion 33 may be concentric with the first portion 28 such that the first portion extends laterally outwardly by substantially the same distance from the side faces of the second portion 33. The contact pad 22 may be substantially circular in plan view.

The metallic diffusion barrier layer 26 may provide a barrier against diffusion between the material of the wire bondable layer 27 and the material of the metallic base layer 25 as well as providing a size and shape for reducing the electric field at edges of the contact pad 22 in the event of a voltage spike.

In some embodiments, the metallic base layer 25 may include copper, for example high purity copper. In these embodiments, the metallic diffusion barrier layer 26 may include nickel phosphorus and the metallic wire bondable layer 27 may include palladium. Palladium is suitable for forming a reliable low ohmic connection to wire bonds including gold or aluminium for example.

In embodiments including an inductive coupler 23, the planar coil 34 and the metallic base layer 25 of the contact pad 22 may include copper, in particular high purity copper.

In some embodiments, a further metallic passivation layer is arranged on the metallic wire bondable layer 27. The metallic passivation layer may be provided to prevent corrosion or oxidation of the metallic wire bondable layer 27, for example during storage before application of the bond wire to the contact pad 22. In the case of a wire bondable layer including palladium, the metallic passivation layer may include gold, for example.

In some embodiments, the wire bondable layer may be omitted and the outer surface of the metallic diffusion barrier 26 may provide a surface onto which a bond wire may be reliably attached.

In some embodiments, the metallic diffusion barrier layer 25 may include Ni, CoW or NiMoP.

In some embodiments, the contact pad includes a Cu anchoring layer having a size and shape corresponding to one of the embodiments of the metallic diffusion barrier layer 26. In the case of a copper metallic base layer 25 and a copper anchoring layer, the copper anchoring layer is not required to have a metallic diffusion barrier function and so is better called an anchoring layer, since the mushroom-type form of the contact pad may be used to provide mechanical anchoring of the contact pad with the surrounding passivation and insulating layers.

The contact pad 22 and, in particular, the shape of the metallic diffusion barrier layer 26 may be formed by suitable selection and structuring of passivation and/or isolation layers and deposition techniques for depositing the contact pad 22 as is described with reference to FIG. 2.

Figure 2:
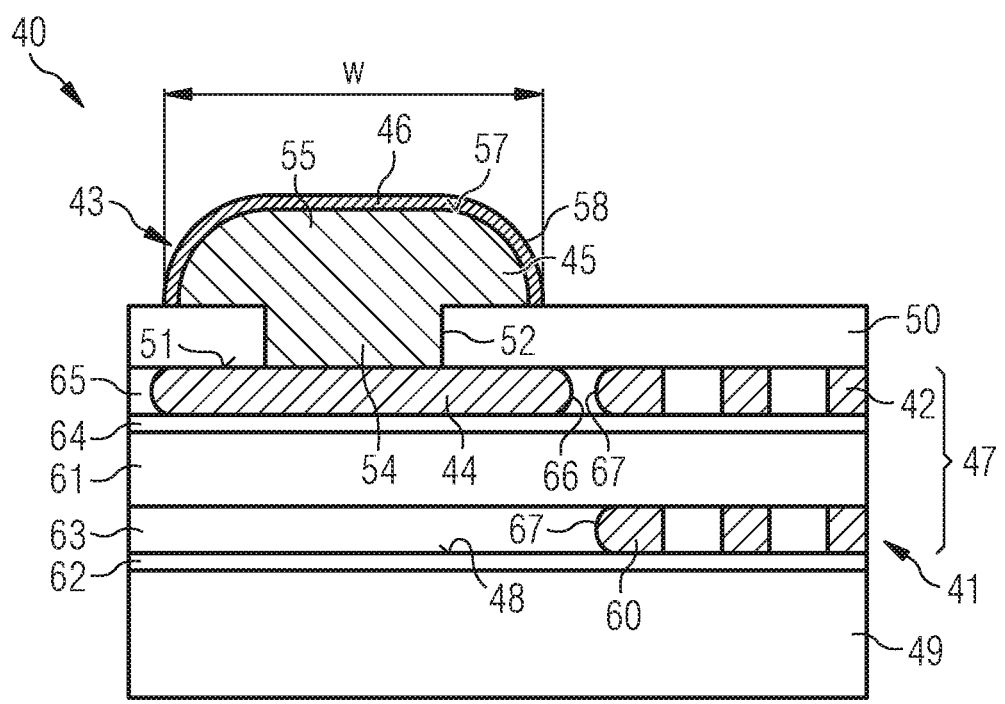
FIG. 2 illustrates a semiconductor device including an inductive coupler including planar coil and a contact pad according to an embodiment.

FIG. 2 illustrates a schematic cross-sectional view of semiconductor device 40 including an inductive coupler 41 including a planar coil 42 coupled to a contact pad 43. The contact pad 43 includes a metallic base layer 44 which is substantially coplanar with the planar coil 42, a metallic diffusion barrier layer 45 arranged on the metallic base layer 44 and a metallic wire bondable layer 46 arranged on the metallic diffusion barrier 45.

The inductive coupler 41 is integrated into a multilayer metallisation structure 47 arranged on an upper surface 48 of a semiconductor die 49. The semiconductor die 49 may include silicon, for example single crystal silicon and may include one or more low-voltage semiconductor devices integrated in the semiconductor die 49 which are not illustrated in the view of FIG. 2.

Reliability of the conductive connection from the inductive coupler 41 to a further device or circuit under fault conditions may be improved with the assistance of an insulating passivation layer 50 arranged on an outermost surface 51 of the metallisation structure 47 which covers the planar coil 42 and peripheral regions of the metallic base layer 44. The passivation layer 50 includes an opening 52 above the metallic base layer 44 of the contact pad 43. The metallic diffusion barrier layer 45 is arranged in the opening 52 such that the opening 52 defines the size and shape of a lower portion 54 of the metallic diffusion barrier layer 45. An upper portion 55 of the metallic diffusion barrier layer 45 extends over the passivation layer 50 adjacent to the opening 52 and includes a lateral area that is greater than a lateral area of the lower portion 54. The planar coil 42 which is electrically coupled to the contact pad 43 may be integrated within the metallisation structure 47 arranged on the upper surface 48 of the semiconductor die 49.

The metallic diffusion barrier layer 45 may be fabricated using galvanic deposition or electrochemical deposition such that the lower portion 54 grows on the exposed surface of the metallic base layer 44 upwardly and after filling the opening 52 in the passivation layer 54 continues to grow upwardly as well as outwardly such that a peripheral region 56 of an upper portion 55 is positioned on the passivation layer 50 and such that the outer surface 57 has a curved surface in the peripheral region 58.

The upper portion 55 of the metallic diffusion barrier layer 45 provides a first portion extending in a transverse plane and having a width w which has a first surface 57 and a second surface opposing the first surface 57. The first surface 57 includes a curved surface at the periphery in the peripheral region 58. The lower portion 54 of the metallic diffusion barrier layer 45 provides a second portion that protrudes from the second surface of the first portion. The second portion protrudes from the second surface at a position intermediate the width w of the first portion.

Curved outer surfaces such as the peripheral region 58 of the contact pad 43 are useful in high-voltage devices, for example. In some embodiments, the side face 66 of the metallic base layer 44 may also have a curved form. Furthermore, at least the outer surface 67 of the outermost winding of the planar coil 42 and of the planar coil 60 may also have a curved form.

A metallic diffusion barrier layer including NiP may be fabricated using electrochemical deposition, CoW by electrochemical deposition, also called electroless deposition, NiMoP by galvanic and electro chemical deposition, Ni by galvanic deposition, for example.

The metallic diffusion barrier 45 may fill the opening 54 in the passivation layer 50 and cover the edge of the opening 54 at the upper surface of the passivation layer 50. During the fabrication of the opening 54 in the passivation layer 50, material of the underlying metallic base layer 44 may be deposited on the side walls of the opening 54 in the passivation layer 50. Such material may have an elongate or spike form with edges which, if not adequately covered with further conductive material, could provide a site for failure due to the formation of a locally increased electric field in a fault condition such as a transient voltage spike. The shape of the metallic diffusion barrier 45, which fills the opening 54 and neighbouring regions of the upper surface of the passivation layer 50 covers such material and may be used to avoid the presence of such a site.

The passivation layer may include $Si_xN_y$, in particular hydrogenated $Si_xN_y$. The thickness of the passivation layer 50 may lie in the range of 0.5 µm to 5 µm and the size of the opening 54 may lie in the range of 50 µm to 120 µm.

As is illustrated in FIG. 2, in some embodiments, the inductive coupler 41 may further include a second planar coil 60 which is arranged underneath the planar coil 42 and spaced apart from the planar coil 42 by one or more dielectric or isolation layers 61. Some embodiments, the dielectric layer 61 may include silicon oxide. Both of the planar coils 42, 60 may be integrated into the metallization structure 47 on the semiconductor die 49.

In some embodiments, the planar coils 42, 60 and the metallic base layer 44 may be fabricated by Damascene techniques. The metallisation structure 47 may include a silicon nitride layer 62 and a silicon oxide layer 63 such that the metallic planar coil 60 is positioned on the silicon nitride layer 62 and embedded within the oxide layer 63. The silicon oxide layer 61 is arranged on the lower plane coil 60, a silicon nitride layer 64 is arranged on the silicon oxide layer 61 and a further silicon oxide layer 65 is arranged on the silicon nitride layer 64. The planar coil 41 and the metallic base layer 44 are arranged on the silicon nitride layer 64 and embedded within the silicon oxide layer 65. The spacing between the planar coils 42, 60 and the material of the dielectric layer 61 may be selected such that the inductive coupler 41 provides basic or reinforced galvanic isolation which fulfils the requirements of VDE 0884-11, IEC 60664-1 or IEC 62368, respectively.

Figure 3B:
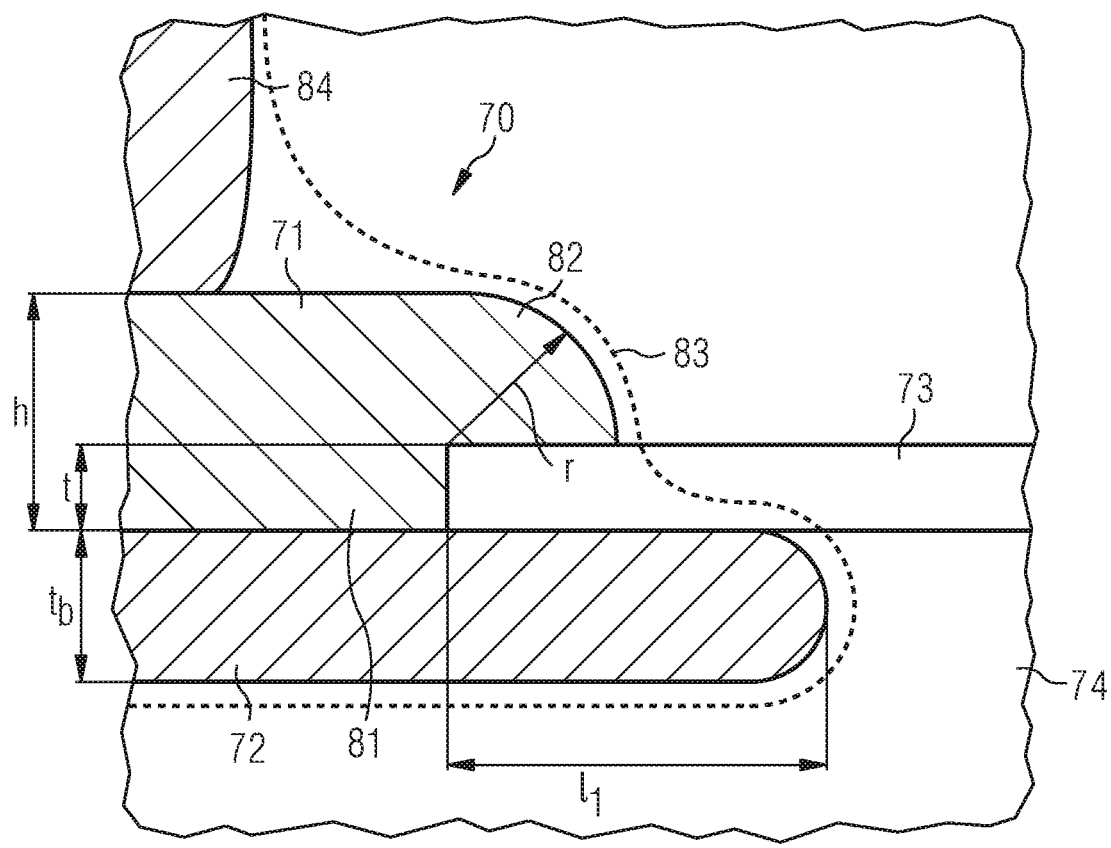

FIG. 3a illustrates a cross-sectional view of a portion of a mushroom-shaped contact pad 70 according to an embodiment, which may be used as the contact pad of an inductive coupler according to any one of the embodiments described herein. FIG. 3a illustrates the dimensions which may be adjusted so as to provide reinforced galvanic isolation for high voltage applications. FIG. 3b illustrates an enlarged view of an edge region of the contact pad 70.

The contact pad 70 includes a mushroom-shaped metallic diffusion barrier layer 71 arranged on a planar metallic base layer 72. The metallic base layer 72 may be part of metallization structure 74 arranged on an upper surface 75 of the semiconductor die 76. The metallic base layer 72 may have a width $w_b$. The contact pad 70 may be substantially circular in plan view such that the metallic base layer 72 and the metallic diffusion barrier layer 71 are also substantially circular plan view. In these embodiments, the width $w_b$ of the metallic base layer 72 may correspond to the diameter of the substantially circular metallic base layer 72.

An electrically insulating passivation layer 73 is arranged on the upper surface 77 of the metallisation structure 74 and on the periphery 78 of the metallic base layer 72. In some embodiments, a distance $l_1$ of the periphery 78 of the metallic base layer 72 is covered by the passivation layer 73. The passivation layer 73 defines an opening 79 exposing the central portion of the upper surface 80 of the metallic base layer 72 in which the metallic diffusion barrier layer 71 is arranged. The base of the metallic diffusion barrier 71 has a width $w_2$ corresponding to the width of the opening 79 in the passivation layer 73. The passivation layer 73 may have a thickness t which defines the height of the second portion 81 of the metallic diffusion barrier layer 71. The metallic diffusion barrier layer 71 may have an overall height h. The first portion 82 of the metallic diffusion barrier layer 71 may have a width $w_1$ which is greater than the width $w_2$ of the second portion 81 positioned within the opening 79 in the passivation layer 73. The first portion 82 therefore extends from the opening 79 over the outermost surface 83 of the passivation layer 73 by distance $l_2$. The width $w_1$ of the first portion 82 of the metallic diffusion barrier is greater than the width $w_2$ of the second portion 81 and is less than the width $w_b$ of the metallic base layer. In the case of substantially circular contact pad 70, distance $l_2$ corresponds to half of the difference in the width of the first portion 82 and the width of the second portion 81, i.e. $l_2=(w_1-w_2)/2$.

In order to achieve basic and/or reinforced galvanic isolation, the relationship between the thickness t of the passivation layer 73 and the length $l_1$ of the periphery 78 of the metallic base layer 72 which is covered by the passivation layer 73 may be suitably selected. In some embodiments, the ratio of t to $l_1$ lies in the range of 0.5 to 1, i.e. $0.5 \leq t/l_1 \leq 1$.

Furthermore, the ratio of the overall height h of the metallic diffusion barrier layer 71 to the extension $l_2$ may be selected such that it lies in the range of 1.5 to 2.5, i.e. $1.5 \leq h/l_2 \leq 2.5$. The periphery of the first portion 82 of the contact pad 70 includes a radius of curvature r. The ratio of the radius of curvature r to the height h of the metallic diffusion barrier layer 71 may lie in the range of $0.5 \leq r/h \leq 2$. The radius of curvature r may be at least twice the thickness t of the passivation layer 73, so that $r>t/2$. The height h of the metallic diffusion barrier layer 71, radius of curvature r of the periphery of the first portion 82 and the thickness t of the passivation layer 73 may be selected such that $h \approx t+r$.

The metallic base layer 72 has a thickness $t_b$. The radius of curvature r may be greater than a third of the thickness $t_b$ of the metallic base layer 72 so that $r \geq t_b/3$. The length $l_1$ of the periphery 78 of the metallic base layer 72 which is covered by the passivation layer 73, the radius of curvature r of the periphery of the first portion 82 and the thickness $t_b$ of the metallic base layer may be selected such that $r/3<l_1<6t_b$.

As an example, the radius of curvature may lie in the range of 3 µm to 5 µm, the width $w_b$ may be around 100 µm, the width $w_2$ may be greater than 20 µm, typically 80 µm to 90 µm and the width $w_1$ is greater than $w_2$ and less than $w_b$ and may be around 85 µm to 98 µm. In some embodiments $w_1=w_2+2r$. The length $l_1$ may be around 10 µm. The length $l_2$ may be around 3 µm. The height h may be around 5 µm. The metallic base layer may have a thickness of around 3 µm.

Some embodiments provide a connection structure including a contact pad having a mushroom-type shape and a bond wire. The connection structure may be used to couple an inductive coupler or a capacitive coupler to a circuit or semiconductor device of a circuit to provide galvanic isolation and signal transmission.

As is indicated schematically by the dotted line 84 in the enlarged view of FIG. 3b, the dimensions and the relationship between the dimensions of the contact pad 70 may be adjusted so as to achieve a value of the voltage at or near the surface of the contact pad 70 and of a bond wire 83 attached to the contact pad 70 which is more uniform and has a smoother form in order to provide reinforced galvanic isolation for high voltage applications. The dimensions and the relationship between the dimensions may be adjusted in order that the value of the voltage at or near the surface of the contact pad 70 and the bond wire 83 is as constant as possible.

Figure 4:
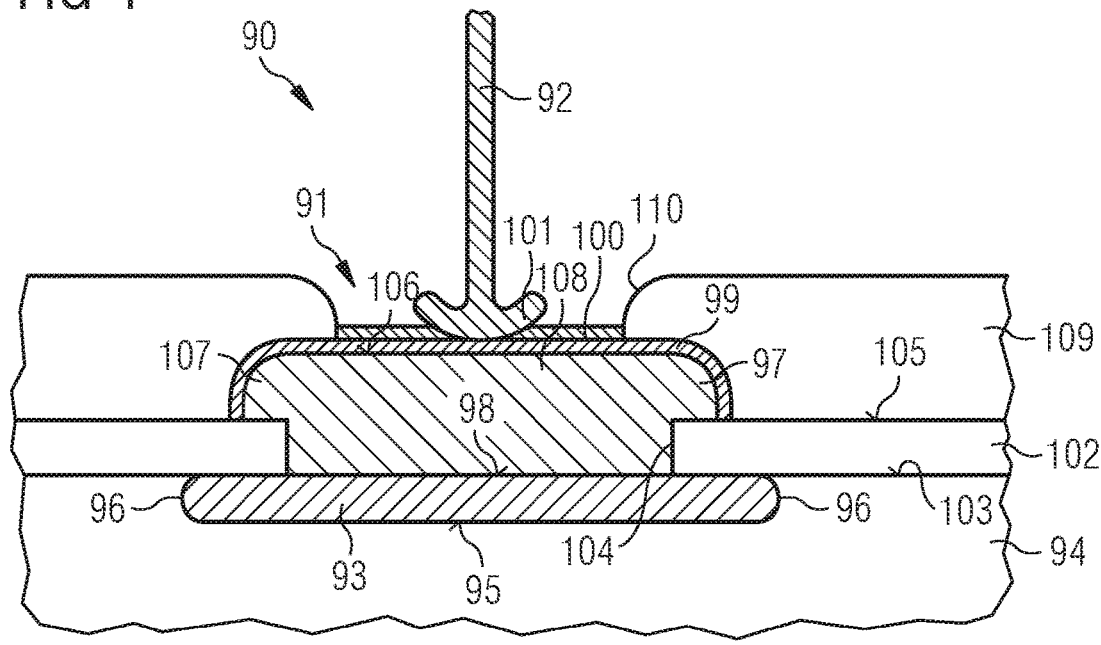
FIG. 4 illustrates a connection structure for an inductive or a capacitive coupler according to an embodiment.

FIG. 4 illustrates a connection structure 90 including a contact pad 91 and a bond wire 92 arranged on, and electrically coupled with, the contact pad 91. The connection structure 90 may be used for inductive bidirectional data exchange in a device having reinforced galvanic isolation. For example, the connection structure 90 may be used in an inductive coupler, including an inductive coupler according to one of the embodiments described herein, or in a capacitive coupler, including a capacitive coupler according to one of the embodiments described herein.

The contact pad 91 includes a metallic base layer 93, a metallic diffusion barrier layer 97 arranged on an upper surface 98 of the metallic base layer 93, a wire bondable layer 99 arranged on the metallic diffusion barrier layer 97 and a metallic passivation layer 100 arranged on the metallic wire bondable layer 99. In particular, after wire bonding, the metallic passivation layer 100 is arranged on the wire bondable layer 99 in regions outside of contact area between the head 101 of the bond wire 92 and the metallic wire bondable layer 99.

The metallic base layer 93 may be positioned in an insulating layer of the metallisation structure 94 positioned on a surface of a semiconductor die which cannot be seen in the view of FIG. 4. In particular, the lower surface 95 and side faces 96 of the metallic base layer 93 may be embedded in a dielectric layer or passivation layer of the metallisation structure 94. In some embodiments, the side faces 96 of the metallic base layer 93 may have a rounded form.

The connection structure 90 may also include a first passivation layer 102 arranged on an upper surface 103 of the metallisation structure 94 and on peripheral regions of the upper surface 98 of the metallic base layer 93. The passivation layer 102 includes an opening 104 which is positioned above the central region of the upper surface 98 of the metallic base layer 93. The lower portion of the metallic diffusion barrier layer 97 is arranged in this opening 104 and extends over the upper surface 105 of the passivation layer 102 such that the outer surface 106 of the metallic diffusion barrier layer 97 has a curved form at the periphery 107 and is substantially planar in the region above the opening 104. The central substantially planar region 108 is suitable for producing a good mechanical and electrical connection between the head 101 of the bond wire 92 and the contact pad 91.

The metallic diffusion barrier layer 97 includes a mushroom-type shape so that the upper portion has a larger area than the lower portion. The contact pad 91 may be substantially circular in plan view. The wire bondable layer 99 is arranged on the upper surface of the metallic diffusion barrier layer 97 and conforms to the curved surface of the periphery 107 such that the outer surface of the wire bondable layer 99 also has a curved form, and curves in the direction of the metallic base layer 93 in its peripheral region. The wire bondable layer 99 may be in contact with the upper surface 105 of the passivation layer 102 laterally adjacent the opening 104.

The connection structure 90 includes a second isolation layer 109 which is arranged on the upper surface 105 of the passivation layer 102 and has a lateral extent such that it extends over the peripheral region 107 of the metallic diffusion barrier layer 97 and in particular onto the peripheral regions of the wire bondable layer 99. The second isolation layer 109 defines an opening 110 exposing the central portion of the wire bondable layer 99. The metallic passivation layer 100 is arranged in this opening 110 and therefore has a lateral extent which is less than the lateral extent of the metallic wire bondable layer 99.

The materials of the various elements of the connection structure 90 may be selected so as to provide particular properties. In an embodiment, the metallic base layer 93 includes copper, in particular high purity copper. The wire bondable layer 99 includes palladium. In order to prevent diffusion between the palladium 99 of the wire bondable layer 99 and the copper of the metallic base layer 93, the metallic diffusion barrier layer 97 may include nickel phosphorus, i.e. a nickel phosphorous alloy. The metallic passivation layer 100 may include gold, for example. The bond wire 92 may include gold or aluminium or Cu or a further metal or alloy capable of forming a low ohmic contact with palladium 99. The interface region between the head 101 of the bond wire 92 and the wire bondable layer 99 may be free of the metallic passivation layer 100.

The first passivation layer 102 may include hydrogenated silicon nitride so as to encourage charge trapping in the passivation layer and the second isolation layer 109 may include an imide, for example polyimide. An imide is useful since it adheres better to the palladium of the wire bondable layer 99 than to copper or nickel phosphorus and, therefore, to the metallic diffusion barrier layer 97 and the metallic base layer 93.

The thickness and materials of the passivation layer 102 and second isolation layer 109 may be selected to provide suitable level of isolation between the bond wire 92 and further devices within the semiconductor die.

After formation of the bond wire connection, the contact pad 91 and bond wire 92 may be encapsulated in a mold compound. The arrangement of the second isolation layer 109 covering the interface between the passivation layer 102 and the metallic diffusion barrier layer 97 and the better adhesion between the second isolation layer 109 and metallic wire bondable layer 99, may be used to hinder or prevent penetration of moisture from the overlying mold compound into this interface and reduce the likelihood of failure during a fault due to evaporation of moisture accumulated at this interface.

Figure 5:
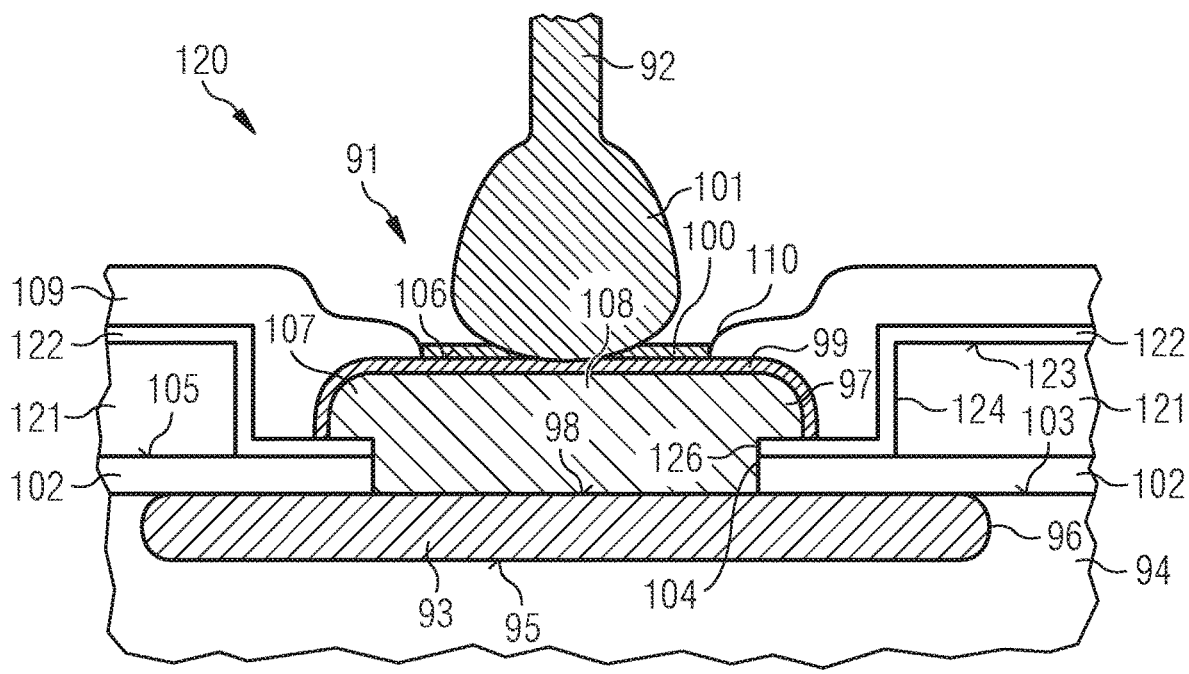
FIG. 5 illustrates a connection structure for an inductive or a capacitive coupler according to an embodiment.

FIG. 5 illustrates a connection structure 120 which may be used for inductive or capacitive bidirectional data exchange in a device having reinforced galvanic isolation and in particular, reinforced galvanic isolation for sporadic, transient overvoltages and/or other interference voltages which may be caused by a lightning strike or other fault circuit for example. The connection structure may be used in a device having galvanic isolation rated for a 3 kV or 10 kV pulse.

The interconnection structure 120 differs from the interconnection structure 90 illustrated in FIG. 4 in the arrangement of the additional isolation layers 121, 122 which increases the total thickness of the isolation layers in regions adjacent the contact pad 91 and bond wire 92.

The connection structure 120 includes a contact pad 91 and a bond wire 92 having a similar structure to that illustrated in FIG. 4. The contact pad 91 includes the metallic base layer 93, the metallic diffusion barrier layer 97, the metallic wire bondable layer 99 and the metallic passivation layer 100. The connection structure also includes the passivation layer 102 arranged on the upper surface 103 of the metallisation structure 94 and in the peripheral regions of the upper surface 98 of the metallic base layer 93 and second isolation layer 109.

The connection structure 120 further includes a third isolation layer 121 which is arranged on the passivation layer 102 adjacent to the opening 104 and under the second isolation layer 109. The third isolation layer 121 may have the form of a ring which is substantially concentric with the opening 104 and with the contact pad 91. The third isolation layer 121 is arranged at a distance from the side faces 96 of the metallic base layer 93. A fourth isolation layer 122 is arranged on the upper surface 123 and side faces 124 of the third isolation layer 121 and extends over the upper surface 105 of the passivation layer 102 to the opening 104 in the passivation layer 102.

The fourth isolation layer 122 also defines an opening 126 which may have substantially the same lateral area as the opening 104. The upper portion of the metallic diffusion barrier layer 97 is positioned on the further isolation layer 122 in regions immediately adjacent to the opening 126. The wire bondable layer 99 also extends over the curved side faces of the upper portion of the metallic diffusion barrier layer 97 and is in contact with the fourth isolation layer 122. The second isolation layer 109 is arranged on the fourth isolation layer 122 and on the peripheral regions of the wire bondable layer 99 as in the connection structure 90 illustrated in FIG. 4. After formation of the bond wire connection, the metallic passivation layer 100, bond wire 92 and second isolation layer 109 may be encapsulated in a mold compound.

The passivation layer 102 may include hydrogenated $Si_xN_y$ and have a thickness of 2 μm and the second isolation layer an imide and have a thickness of 3 μm to 12 μm. The third isolation layer 121 may include phosphosilicate glass (PSG) or $SiO_x$ and may have a thickness of 3 μm to 12 μm, typically 7 μm. The fourth isolation layer 122 may include hydrogenated $Si_xN_y$ and may have a thickness of 300 nm. The opening 110 in the second isolation layer 109 may have a diameter in the range of 50 μm to 120 μm.

As an example, for a nailhead bond connection, the bond wire 92 may have a diameter of 25 μm to 30 μm and the head 101 of the bond wire 92 a diameter of around 60 μm and a height of around 30 μm.

Figure 6A:
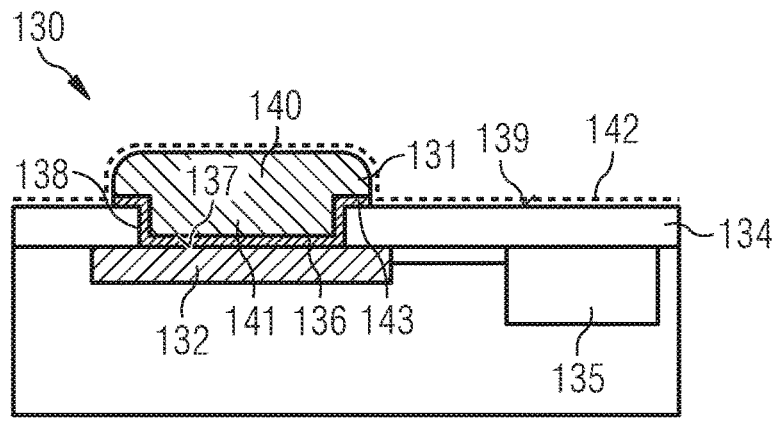
FIG. 6a illustrates a contact pad for an inductive or a capacitive coupler according to a further embodiment.
Figure 6B:
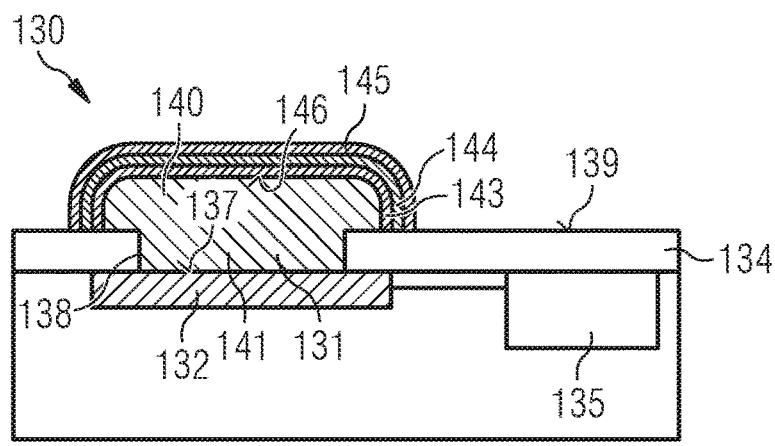
FIG. 6b illustrates a contact pad for an inductive or a capacitive coupler according to a further embodiment.

FIGS. 6a and 6b illustrate a contact pad 130 according to alternative embodiments. The contact pad 130 includes a metallic anchoring layer 131 arranged on a metallic base layer 132. The metallic base layer 132 and the anchoring layer 131 may include Cu. The anchoring layer 131 has a size and shape corresponding to one of the embodiments of the metallic diffusion barrier layer and has a mushroom-type form with an upper portion with a greater lateral area than a lower portion. The upper portion has a periphery with a curved form, curving in the direction of the lower portion. The position and volume of the lower portion is defined by an opening in an insulation layer 134 which covers peripheral regions of a metallic base layer 132.

In the case of a copper metallic base layer 132 and a copper anchoring layer 131, the anchoring layer 131 is not required to have a metallic diffusion barrier function and so is better called an anchoring layer, since the mushroom-type form of the contact pad 130 may be used to provide mechanical anchoring of the contact pad 130 with the surrounding passivation and/or insulating layers 134. The contact pad 130 may be used in a galvanically isolated signal transfer coupler 135 in the form of an inductive coupler or a capacitive coupler.

The anchoring layer 131 may be treated after deposition by wet etching, for example, to produce the curved form at the periphery of the upper portion.

In the embodiment illustrated in FIG. 6a, the insulating layer 134 includes $SiO_x$ and contact pad 130 may include an adhesion promotion layer 136, which is arranged on the exposed portion of the upper surface 137 of the metallic base layer 132, on the side walls of the opening 138 in the insulating layer 134 and on regions of the upper surface 139 of the insulting layer 134 adjacent the opening 138. The upper portion 140 of the anchoring layer 131 is arranged on and extends outwardly from the adhesion promotion layer 136. The lower portion 141 of the anchoring layer 131 fills the opening 138. An insulating passivation layer 142, for example a layer of $Al_2O_3$ or $Si_xN_y$ having a thickness of not more than a few atoms, may be arranged on the outermost surface of the contact pad 130. The insulating passivation layer 142 may cover the upper surface 139 of the insulating layer 134, side face of the adhesion promotion layer 136 and free lying outer surfaces 143 of the anchoring layer 131.

In the embodiment illustrated in FIG. 6b, the insulating layer 134 includes $Si_xN_y$ and the anchoring layer 131 is in direct contact with the upper surface 137 of the metallic base layer 132, the side walls of the opening 138 and the upper surface 139 of the insulating layer 134. The contact pad 130 further includes one or more layers arranged on the outer surface of the anchoring layer. In some embodiments, a NiP layer 143 is arranged on the outer surface 146 of the anchoring layer 131, a Pd layer 144 on the NiP layer 143 and a Au layer 145 on the NiP layer 144.

The upper portion 140 of the anchoring layer 131 provides a first portion having an outer surface 146 or first surface and a second surface opposing the first surface. The first surface of this first portion has a curved surface at the periphery. The first portion extends in a transverse plane and has a width. The lower portion 141 of the anchoring layer 131 provides a second portion protruding from the second surface of the first portion intermediate the width of the first portion.

Figure 7:
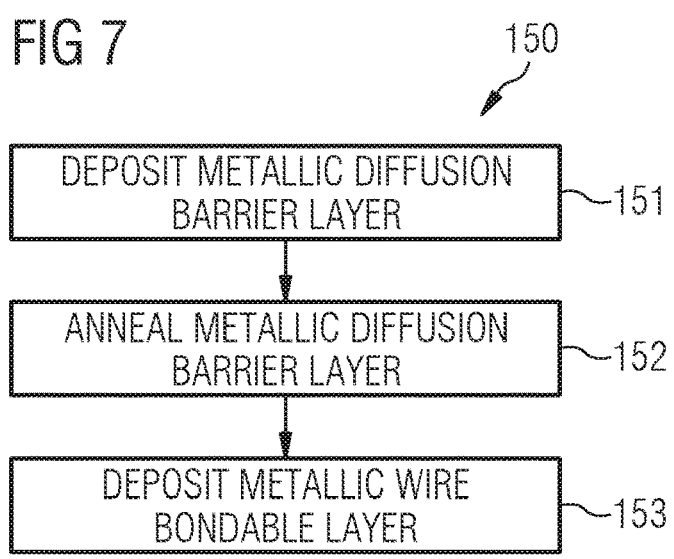
FIG. 7 is a flow chart of a method for fabricating a contact pad for an inductive or a capacitive coupler.

FIG. 7 illustrates a flow chart 150 of a method for fabricating a contact pad which may be used for an inductive coupler providing bidirectional signal exchange and basic and/or reinforced galvanic isolation.

In box 151, a metallic diffusion barrier layer is deposited onto a surface of a metallic base layer exposed in an opening of a first isolation layer that covers a peripheral region of the metallic base layer such that the metallic diffusion barrier layer extends onto an outer surface of the first isolation layer. In box 152, the metallic diffusion barrier layer is annealed. In box 153, a metallic wire bondable layer is deposited onto the annealed metallic diffusion barrier layer.

The metallic diffusion barrier layer is annealed before the deposition of the subsequent metallic layer or layers. This method may be used so that the subsequently deposited layer can provide a seal for any gap that may be formed between the metallic diffusion barrier and the opening in the first isolation layer that may arise due to relaxation and contraction of the metallic diffusion barrier layer during annealing.

The outer surface of the metallic diffusion barrier may have a curved form at its periphery and extend towards the first isolation layer. The central position of the metallic diffusion barrier layer which is bounded by the periphery may be substantially planar.

The metallic diffusion barrier layer may be deposited using electro-chemical deposition or galvanic deposition depending on the composition. A NiP metallic diffusion barrier layer may be deposited using electro-chemical deposition. An external power source is used in galvanic deposition, whereas no external power source is used in electro-chemical deposition. Electro-chemical deposition is also referred to as electroless deposition. These methods may be used to produce an outer surface having a curved form at the periphery due to the growth mechanism of the metallic diffusion barrier on the first isolation layer in regions adjacent to the opening.

The metallic wire bondable layer may be deposited galvanically or by electroless deposition depending on the composition. For example, Pd may be deposited by electroless deposition and Ni by galvanic deposition. The wire bondable layer may conform to the shape of the underlying metallic diffusion barrier layer and also have a curved form at its periphery.

In some embodiments, a second isolation layer is deposited onto peripheral regions of the metallic wire bondable layer. The second isolation layer may include a material that has good adhesive properties to the wire bondable layer and/or better adhesive properties to the wire bondable layer compared to the metallic diffusion barrier layer. This arrangement may be used to prevent delamination of the second isolation layer from the conductive contact pad.

In some embodiments, a metallic passivation layer is deposited onto the metallic wire bondable layer such that the second isolation layer defines the lateral extent of the metallic passivation layer. The metallic passivation layer has a lateral extent that is less than the lateral extent of the underlying metallic wire bondable layer and head of the metallic diffusion barrier layer, since the second isolation layer is arranged on the peripheral region of the wire bondable layer. The metallic passivation layer may be used to hinder oxidation or contamination of the wire bondable layer during production and storage, in particular, before a wire bond is attached to the contact pad. The metallic passivation may not form a part of the bond between the wire bond and the contact pad.

A connection structure can be formed by applying a bond wire to the substantially planar central portion of the contact pad, for example using a nail head wire bonding technique.

Figure 8A:
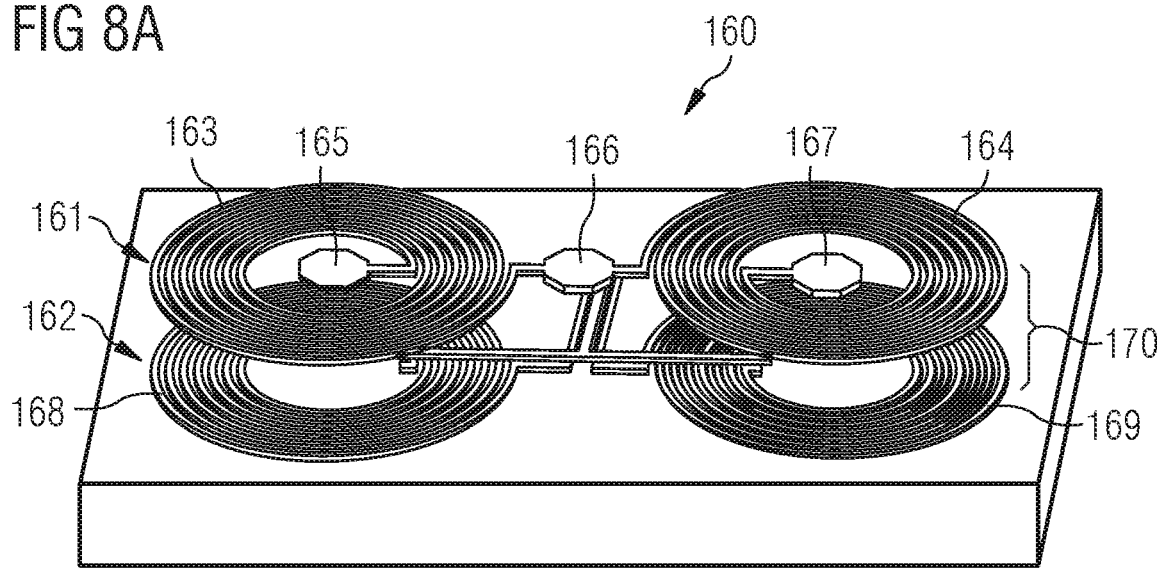
FIG. 8a illustrates a perspective view of an inductive coupler according to an embodiment.

FIG. 8a illustrates a perspective view of an example of an inductive coupler 160 which may be coupled to a circuit by the connection structure according to one of the embodiments described herein to provide galvanic isolation. The inductive coupler 160 may also be used in the device according to one of the embodiments descried herein.

The inductive coupler 160 includes a primary side 161 and a secondary side 162 whereby each of the primary side 141 and secondary side 162 includes at least one planar coil. In the embodiment illustrated in FIG. 7a, each of the primary side 161 and the secondary side 162 includes two substantially coplanar spiral planar coils 163, 164; 168, 169. The secondary side 161 includes a contact pad 165 arranged in the centre of the spiral planar coil 163, a contact pad 166 which is arranged between and coupled to the outer end of the two spiral planar coils 163 and 164 and a contact pad 167 which is arranged in the centre of the spiral planar core 164.

The shape and structure of the contact pad according to one of any one of the embodiments described herein may be used for the central pad 166, whereby the metallic base layer is coplanar with and coupled to the planar coils 163, 164. In some embodiments one or both of contact pads 165, 167 also includes a structure according to any one of the embodiments described herein. The shape, size and structure of the contact pads 165, 167 may be the same as that of the contact pad 166 or different.

The primary side 164 also includes two coplanar spiral planar coils 168, 169 which are positioned underneath and spaced apart by a dielectric layer 170 from the respective spiral planar coil 163, 164 of the secondary side 162. The planar coils 168, 169, 163, 164 are electrically conductive and may be integrated on a silicon chip and, in particular, in differing layers of a multilayer metallisation structure. The spiral planar coils 163, 164, 168, 169 may include high purity copper and be fabricated using Damascene techniques, for example.

However, in other embodiments, the inductive coupler may include a single coil in the primary side 161 and a single coil in the secondary side 162. The planar coil or coils need not be spiral and need not be substantially circular.

Figure 8B:
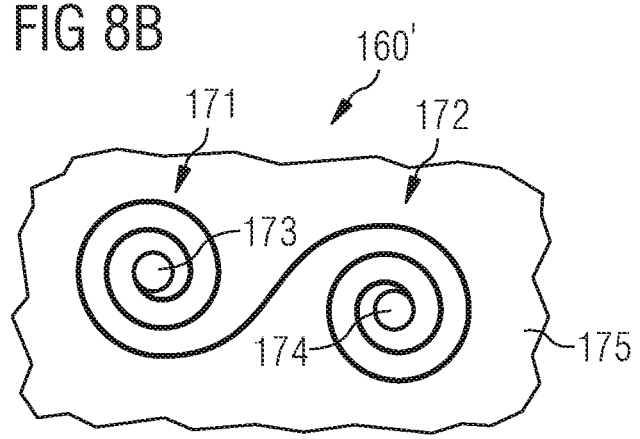
FIG. 8b illustrates a plan view of planar spiral coils for an inductive coupler.
Figure 8C:
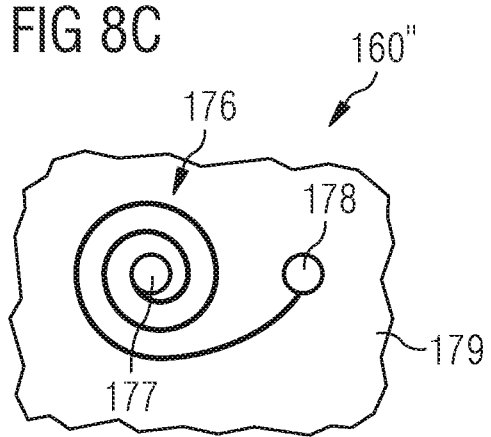
FIG. 8c illustrates a plan view of a planar spiral coil for an inductive coupler.

FIGS. 8b and 8c illustrate further embodiments of planar spiral coils which may be used for the primary or secondary side of an inductive coupler.

FIG. 8b illustrates an embodiment of an inductive coupler 160' including two planar spiral coils 171, 172, whereby a contact pad 173, 174 is arranged at the centre of each of the two planar spiral coils 171, 172 and the two planar spiral coils 171, 172 are coupled by a substantially S-shaped connection. The two planar spiral coils 171, 172 may be surrounded by a continuous conductive isolation coil 175.

FIG. 8c illustrates an embodiment of an inductive coupler 160" including a single planar spiral coil 176, whereby a first contact pad 177 is arranged at the centre of the planar spiral coil 176 and a second contact pad 178 is arranged at the outer end of the planar spiral coil 177. The planar spiral coil 176 and contact pads 177, 178 may be surrounded by a continuous conductive isolation coil 179.

The device including the inductive coupler or capacitive coupler and the connection structure according to any one of the embodiments described herein may be used to provide galvanic isolation, such as basic galvanic isolation or reinforced galvanic isolation in various applications and circuits.

Figure 9A:
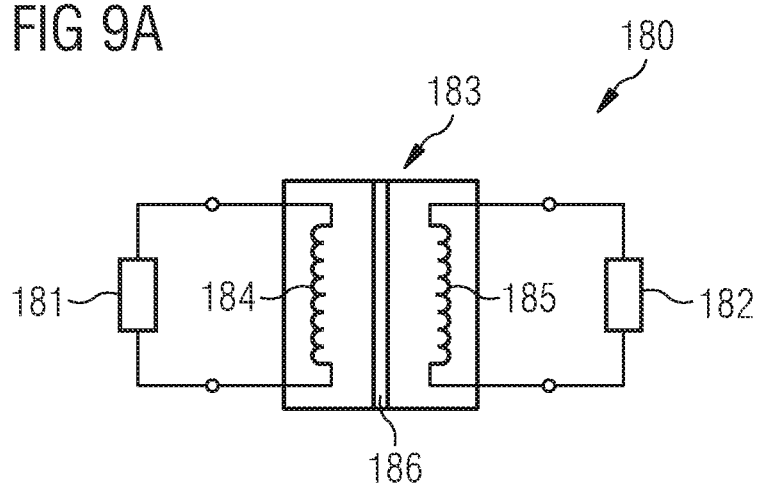
FIG. 9a illustrates a schematic circuit diagram of a system including an inductive coupler providing galvanic isolation and signal transfer.

FIG. 9a illustrates a schematic view of a system 180 including a first circuit 181, a second circuit 182 and galvanic isolation provided by an inductive coupler 183. The inductive coupler 183 includes a first coil 184 electrically coupled to the first circuit 181 and a second coil 165 electrically coupled to the second circuit 182 and galvanic isolation 186 arranged between the first coil 184 and the second coil 185.

The first circuit 181 and the second circuit 182 of the system 180 may include a single device or two or more devices forming a circuit. The inductive coupler 183 may include one or two coils on the primary side and the secondary side. The system 180 may be used for power conversion so that the circuits 181, 182 may include a power conversion system and a driver circuit, for example.

Figure 9B:
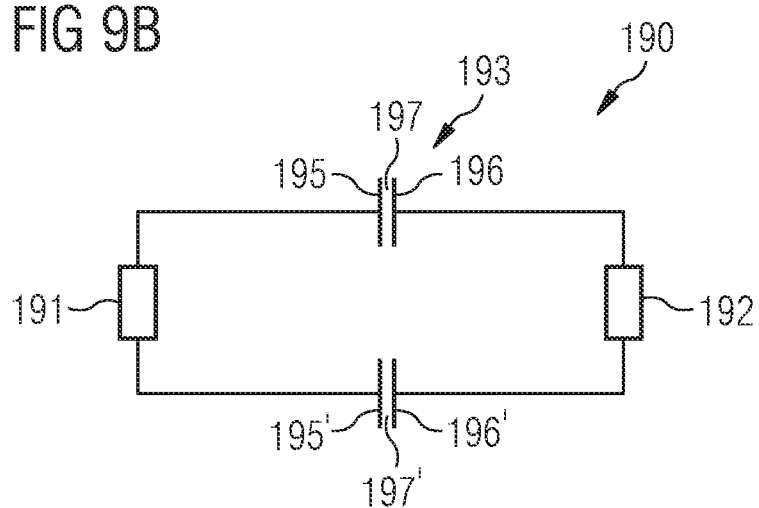
FIG. 9b illustrates a schematic circuit diagram of a system including a capacitive coupler providing galvanic isolation and signal transfer.

FIG. 9b illustrates a schematic view of a system 190 including a first circuit 191, a second circuit 192 and galvanic isolation provided by two capacitive couplers 193, 194. The first circuit 191 may be a high voltage circuit and the second circuit 192 a low voltage circuit. Alternatively, both the first circuit 191 and the second circuit 192 may be high voltage circuits or the first circuit 191 may be a low voltage circuit and the second circuit 192 may be a high voltage circuit.

Each capacitive coupler 193, 194 includes two conductive plates 195, 196; 195', 196' galvanically separated from one another by a dielectric material 197; 197'. The dielectric material 197; 197' has a dielectric strength that is sufficiently high such that the required level of galvanic isolation, for example basic or reinforced, is provided. For example, the dielectric layer 197 can withstand a plate-to-plate voltage difference of 5 $kV_R$m without suffering dielectric breakdown.

The capacitive coupler utilizes changes in capacitance to transmit signals. In operation, the first circuit 191 transmits data to second circuit 192 by encoding the data, and then placing encoded data signals in the form of pulses, RF waveforms, or glitches onto the plate 195. The signals are capacitively coupled to low-voltage plate 196, and are then detected and decoded by the second circuit 192.

In the systems of FIGS. 9*a* and 9*b*, the primary and secondary sides are galvanically isolated from the other and connected only through the inductive or capacitive couplers. The system may have the capability to provide bi-directional data between the primary side and the secondary side. In addition, power may be provided to the secondary side from the primary side. The primary side may drive the secondary side through one or more drivers (not illustrated) and the secondary side may provide data for sensing to the primary side.

Figure 10:
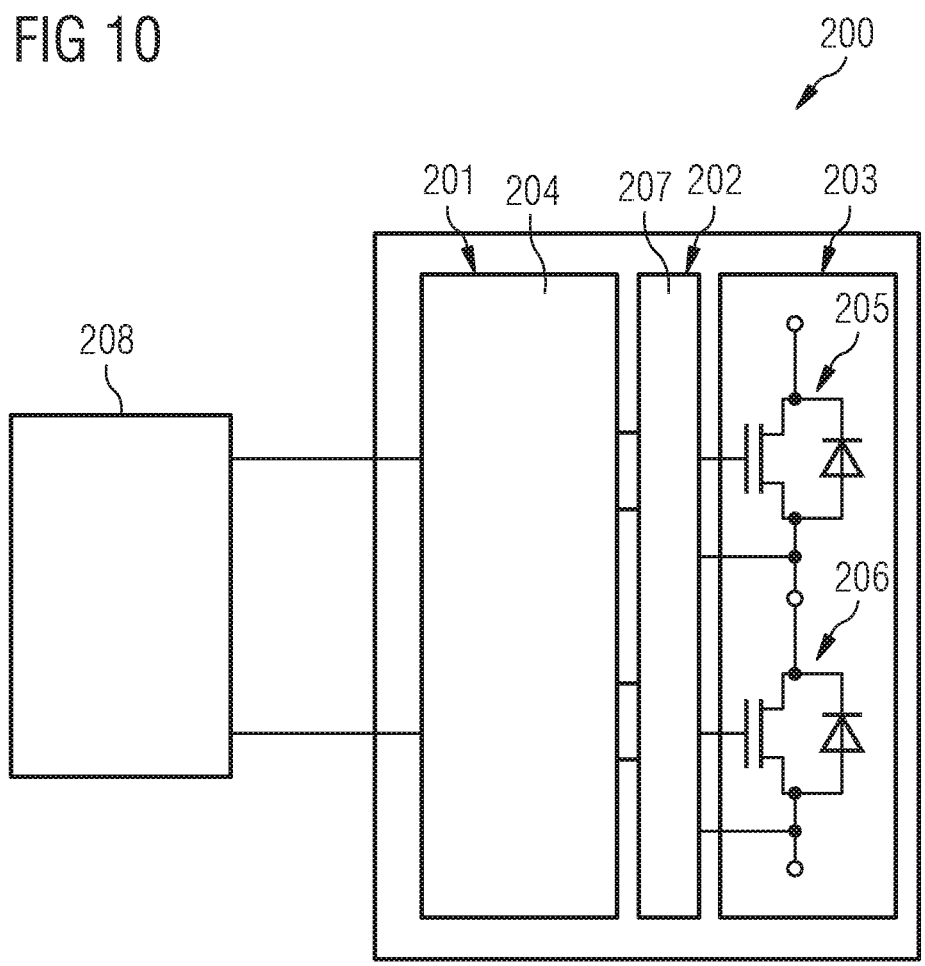
FIG. 10 illustrates a schematic diagram of a power conversion device including an inductive coupler providing galvanic isolation and signal transfer.

FIG. 10 illustrates a schematic diagram of example of a power semiconductor module 200 which may include the inductive coupler and/or connection structure according to one or more of the embodiments described herein. The power semiconductor module 200 may include a capacitive coupler in place of the inductive coupler. The module 200 has three blocks 201, 202, 203. Block 201 includes one or more driver circuits which may be integrated into a semiconductor driver component 204. Block 202 includes a power section which may include two or more semiconductor switches 205, 206, such as power transistors, which may be coupled to provide a half-bridge circuit, for example.

Block 203 ensures galvanic isolation between the driver circuit 201 and the power section 202. The galvanic isolation can be integrated in the driver component 204 or be formed by a separate component. The galvanic isolation may be provided by an inductive coupler 207 having a contact pad according to one of the embodiments described herein. The inductive coupler may be coupled to the driver component 204 by a connection structure according to one of the embodiments described herein. The drive circuit 201 may be coupled to a further control unit 208 which is external to the module 200.

Figure 11:
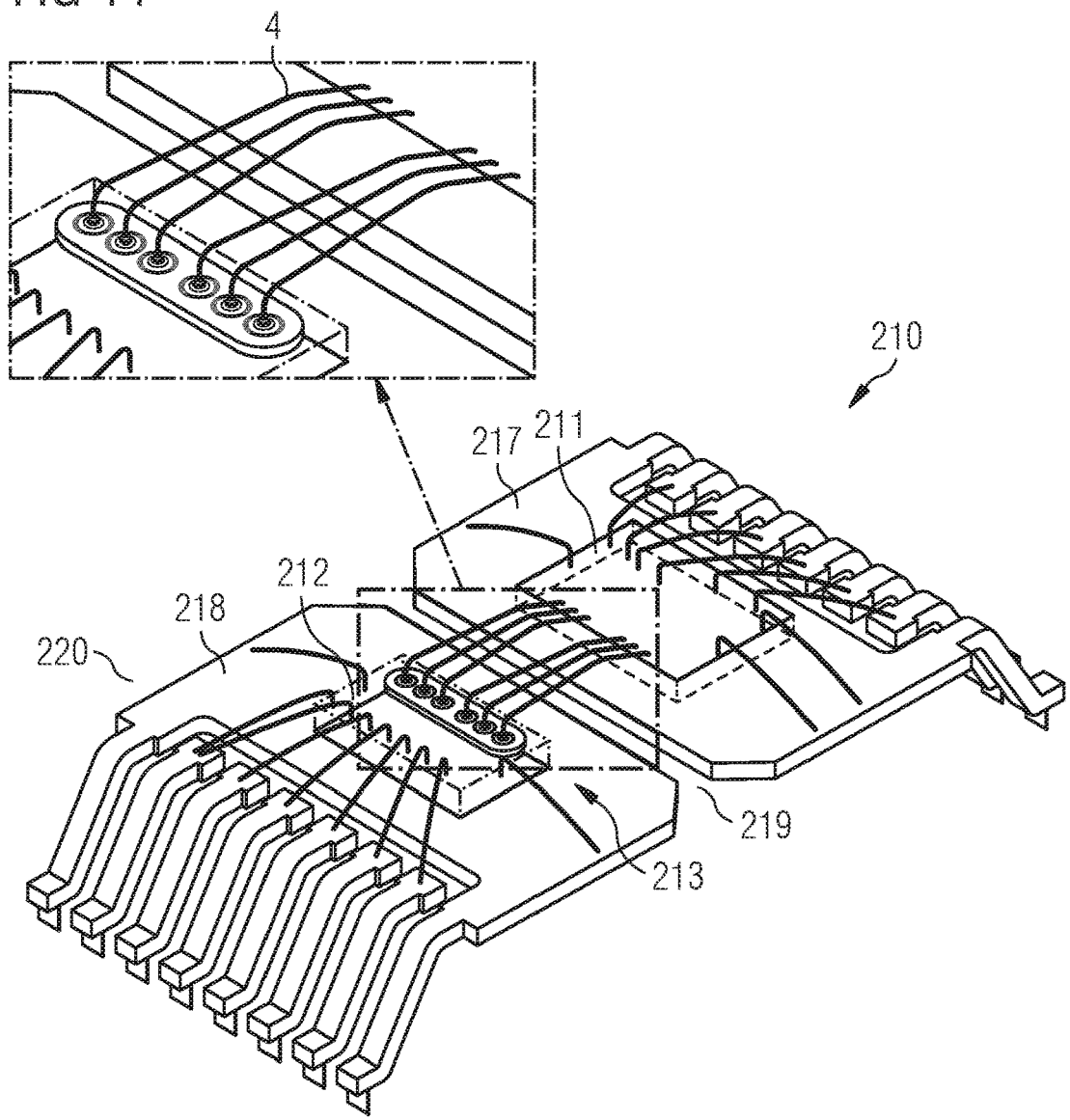
FIG. 11 illustrates an electronic component including at least two semiconductor devices with a bidirectional data exchange path including an inductive coupler.
Figure 12:
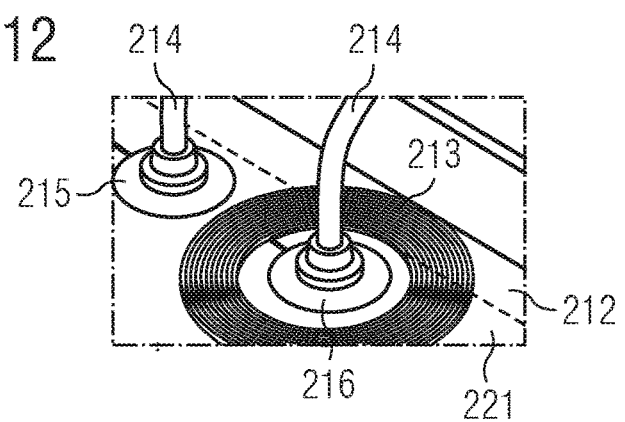
FIG. 12 illustrates a detailed view of the connection structure to the contact pad of the inductive coupler of FIG. 11.

FIG. 11 illustrates an example of an electronic component 210 including a first semiconductor die 211, a second semiconductor die 212 and at least one inductive coupler 213 according to one of the embodiments described herein which provides reinforced galvanic isolation. FIG. 12 illustrates the more detailed view of a portion of the inductive coupler 213 of FIG. 12 and in particular, the bond wire connections 214 to the contact pads 215, 216.

The inductive coupler 213 is coupled in the bidirectional signal exchange path between the first semiconductor die 211 and the second semiconductor die 212. In the embodiment illustrated in FIG. 11, the inductive coupler 213 has the structure illustrated in FIG. 8*a*.

The first semiconductor die 211 is arranged on a first die pad 217 and the second semiconductor die 212 is arranged on a second die pad 218. The second die pad 218 is spaced apart from the first die pad 217 and isolated therefrom by the mold compound 219 providing the housing 220 of the semiconductor component 210.

The inductive coupler 213 is integrated into the metallization structure 221 arranged on the upper surface of the second semiconductor die 212. The inductive coupler 213 is electrically coupled so as to provide a signal path between the first semiconductor die 211 and the second semiconductor die 212 by bond wires 214.

The contact pad 215 which is coupled to the outer end of the two spiral planar coils 223, 224 of the inductive coupler 213 may have a structure according to one of the embodiments described herein and, in particular, may have a rounded or curved periphery.

The first semiconductor die 211 may include a logic, operation amplifier or a Schmitt trigger circuit and the second semiconductor die 212 may include a gate driver, or ADC (Analogue Digital Converter) circuit with Schmitt trigger.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a galvanically isolated signal transfer coupler comprising a first coupler and a second coupler configured to transfer signals therebetween, wherein the first coupler and the second coupler are galvanically isolated from each other, and a contact pad that is electrically connected to the first coupler,
wherein the contact pad comprises:
a metallic base layer;
a metallic diffusion barrier layer arranged on and electrically coupled to the metallic base layer; and
a metallic wire bondable layer arranged on and electrically coupled to the metallic diffusion barrier layer,
wherein the metallic diffusion barrier layer comprises:
a first portion having a first surface and a second surface opposing the first surface, the first surface having a curved surface at a periphery, the first portion extending in a transverse plane and having a width; and
a second portion protruding from the second surface intermediate the width of the first portion.

2. The semiconductor device of claim 1, further comprising a first isolation layer arranged on peripheral regions of the metallic base layer and having a first opening exposing a portion of the metallic base layer, wherein the second portion of the metallic diffusion barrier layer is arranged in the first opening in the first isolation layer, and wherein the first portion of the metallic diffusion barrier layer extends onto a surface of the first isolation layer adjacent the first opening.

3. The semiconductor device of claim 1, further comprising a metallic passivation layer on the metallic wire bondable layer.

4. The semiconductor device of claim 3, wherein at least one of: the metallic base layer comprises copper; the metallic diffusion barrier layer comprises NiP; the metallic wire bondable layer comprises Pd; and the metallic passivation layer comprises Au.

5. The semiconductor device of claim 2, further comprising a second isolation layer arranged on peripheral regions of the metallic wire bondable layer and comprising a second opening exposing a portion of the metallic wire bondable layer.

6. The semiconductor device of claim 5, wherein a metallic passivation layer is arranged in and bounded by the second opening.

7. The semiconductor device of claim 5, further comprising a third isolation layer comprising a ring arranged on the first isolation layer and a fourth isolation layer arranged on outer faces of the third isolation layer.

8. The semiconductor device of claim 7, wherein the first isolation layer comprises hydrogenated SixNy, the second isolation layer comprises an imide, the third isolation layer comprises SiOx or phosphosilicate glass, and the fourth isolation layer comprises hydrogenated SixNy.

9. The semiconductor device of claim 1, wherein the galvanically isolated signal transfer coupler comprises an inductive coupler, the inductive coupler comprises the first coupler, and the first coupler comprises a first planar coil coupled to the contact pad.

10. The semiconductor device of claim 9, wherein the inductive coupler comprises a second planar coil arranged in a stack with the first planar coil and galvanically isolated from the first planar coil by an isolation layer comprising SiOx and is configured to provide reinforced galvanic isolation for a surge pulse isolation voltage $V_{IOSM}$ of at least 10kVpeak.

11. The semiconductor device of claim 10, further comprising a third planar coil arranged substantially coplanar with the first planar coil and coupled to the contact pad.

12. The semiconductor device of claim 9, wherein the first planar coil and the metallic base layer are integrated in a semiconductor die.

13. The semiconductor device of claim 1, wherein the galvanically isolated signal transfer coupler comprises a capacitive coupler, the capacitive coupler comprises the first coupler, the first coupler comprises a plate of the capacitive coupler, and wherein the contact pad provides the plate of the capacitive coupler.

14. An electronic component, comprising:
   a semiconductor device comprising a galvanically isolated signal transfer coupler comprising a contact pad;
      wherein the contact pad comprises:
         a metallic base layer;
         a metallic diffusion barrier layer arranged on the metallic base layer; and
         a metallic wire bondable layer arranged on the metallic diffusion barrier layer,
         wherein the metallic diffusion barrier layer comprises:
            a first portion having a first surface and a second surface opposing the first surface, the first surface of the first portion having a curved surface at the periphery, the first portion extending in a transverse plane and having a width; and
            a second portion protruding from the second surface intermediate the width of the first portion; and
         a bidirectional signal transfer path coupled to the semiconductor device;
      wherein the galvanically isolated signal transfer coupler is coupled in the bidirectional signal transfer path, is coupled by a bond wire to the semiconductor device and provides reinforced galvanic isolation for a surge pulse isolation voltage $V_{IOSM}$ of at least 10kVpeak.

15. The electronic component of claim 14, further comprising a further semiconductor device coupled to the semiconductor device by the bidirectional signal transfer path.

* * * * *